United States Patent
Fujino et al.

(10) Patent No.: US 7,554,373 B2
(45) Date of Patent: Jun. 30, 2009

(54) PULSE WIDTH MODULATION CIRCUIT WITH MULTIPHASE CLOCK

(75) Inventors: Satoshi Fujino, Kanagawa (JP); Yoshihisa Isobe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 43 days.

(21) Appl. No.: 11/171,433

(22) Filed: Jul. 1, 2005

(65) Prior Publication Data
US 2006/0001467 A1    Jan. 5, 2006

(30) Foreign Application Priority Data
Jul. 2, 2004    (JP)    ............... 2004-196354

(51) Int. Cl.
*H03K 3/017*    (2006.01)
(52) U.S. Cl. ...................... 327/175; 375/373
(58) Field of Classification Search ................ 327/147, 327/149, 156, 172–176, 261, 263–264, 276–284; 375/238, 373–376; 331/17, 25, DIG. 2
See application file for complete search history.

(56) References Cited

U.S. PATENT DOCUMENTS

| | | | |
|---|---|---|---|
| 5,325,396 A * | 6/1994 | Critchlow et al. | ........... 375/222 |
| 5,485,490 A | 1/1996 | Leung et al. | |
| 6,452,458 B1 | 9/2002 | Tanimoto | ...................... 331/57 |
| 6,473,457 B1 * | 10/2002 | Pascual et al. | .............. 375/238 |
| 7,038,510 B2 * | 5/2006 | Zhang | ......................... 327/158 |
| 7,113,014 B1 * | 9/2006 | Doyle | .......................... 327/172 |
| 7,148,502 B2 * | 12/2006 | Yamazaki et al. | .............. 257/40 |
| 2001/0045853 A1 | 11/2001 | Saeki | .......................... 327/233 |

FOREIGN PATENT DOCUMENTS

| | | | |
|---|---|---|---|
| JP | 56-69929 | | 6/1981 |
| JP | 05091274 A | * | 4/1993 |
| JP | 6-177723 | | 6/1994 |
| JP | 2000-125127 | | 4/2000 |

OTHER PUBLICATIONS

Chinese Office Action dated Sep. 28, 2007.

* cited by examiner

*Primary Examiner*—Lincoln Donovan
*Assistant Examiner*—Thomas J Hiltunen
(74) *Attorney, Agent, or Firm*—McGinn IP Law Group, PLLC

(57) ABSTRACT

In a pulse width modulation circuit, a multiphase clock generation section generates a multiphase clock signal according to a reference clock. Then, a pulse width modulation signal is generated according to input data and the multiphase clock signal generated by the multiphase clock generation section. The multiphase clock generation section has a phase lock loop circuit and generates the multiphase clock signal by phase-interpolating an intermediate clock signal generated by the phase lock loop circuit.

19 Claims, 14 Drawing Sheets

| S1 | S2 | PWM PULSE |
|---|---|---|
| 0 | 0 | 0 |
| 0 | 1 | P1 |
| 1 | 0 | P2 |
| 1 | 1 | P1 OR P2 |

T1: CLOCK FOR RISE1
T2: CLOCK FOR FALL1
T3: P1
T4: CLOCK FOR RISE2
T5: CLOCK FOR FALL2
T6: P2
T7: CLOCK FOR INTERLEAVE
T8: S1
T9: S2
T10: PWM PULSE

PULSE WIDTH MODULATION CIRCUIT WITH MULTIPHASE CLOCK

BACKGROUND OF THE INVENTION

1. Field of the Invention

The present invention relates to a pulse width modulation circuit which modulates a pulse width according to input data.

2. Description of Related Art

Laser beam printers (LBPs) and digital copiers having a laser have been widely used because of their high-resolution, silent, and high-speed features. Pulse width modulation (PWM) is a main technique for controlling print tone in these devices. The pulse width modulation controls the tone or density of each printing dot by pulse width.

There are broadly two systems for conventional pulse width modulation: counter and delay. A counter system is disclosed in Japanese Unexamined Patent Publication No. 56-69929 (Imai et al.), for example. In the counter system, a counter counts reference clocks, and a comparator compares the count value with a digital pulse data value or input data. When the both values match, the system changes a PWM output.

On the other hand, a delay system is disclosed in Japanese Unexamined Patent Publication No. 06-177723 (Oshima), for example. The delay system inputs a reference clock to a delay circuit, selects the one corresponding to a digital pulse data value from a plurality of delay signals output from the delay circuit, and changes a PWM output.

However, the counter system and the delay system used for conventional pulse width modulation circuits have a problem that high-speed, high-accuracy operation is difficult.

For example, a case of generating a PWM pulse with 100 MHz, 8-bit resolution is as follows. In this case, a resolution is, when converted to time, 1 s/100 MHz/$2^8 \approx 40$ ps. This indicates that it is necessary in the counter system that a counter circuit operates with a clock cycle tCK=40 ps or less, and in the delay system that a delay time in each cell stage constituting a delay circuit is 40 ps or less. Current CMOS technology can hardly implement such performance.

The limitation of 40 ps may be relaxed by performing interleaving process. However, this increases the number of divisions in interleave, which generates new problems such as an increase in the circuit size and a relative variation in each stage.

SUMMARY OF THE INVENTION

According to the present invention, there is provided a pulse width modulation circuit which comprises a multiphase clock generation section generating a multiphase clock signal according to a reference clock, and a pulse width modulation signal generation section generating a pulse width modulation signal according to input data and the multiphase clock signal generated by the multiphase clock generation section. The multiphase clock generation section includes a phase lock loop circuit and generates the multiphase clock signal by phase-interpolating an intermediate clock signal generated by the phase lock loop circuit. This configuration achieves high-speed, high-accuracy operation since multiphase clock signals are generated by a phase interpolation operation in addition to an operation by a phase lock loop circuit.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
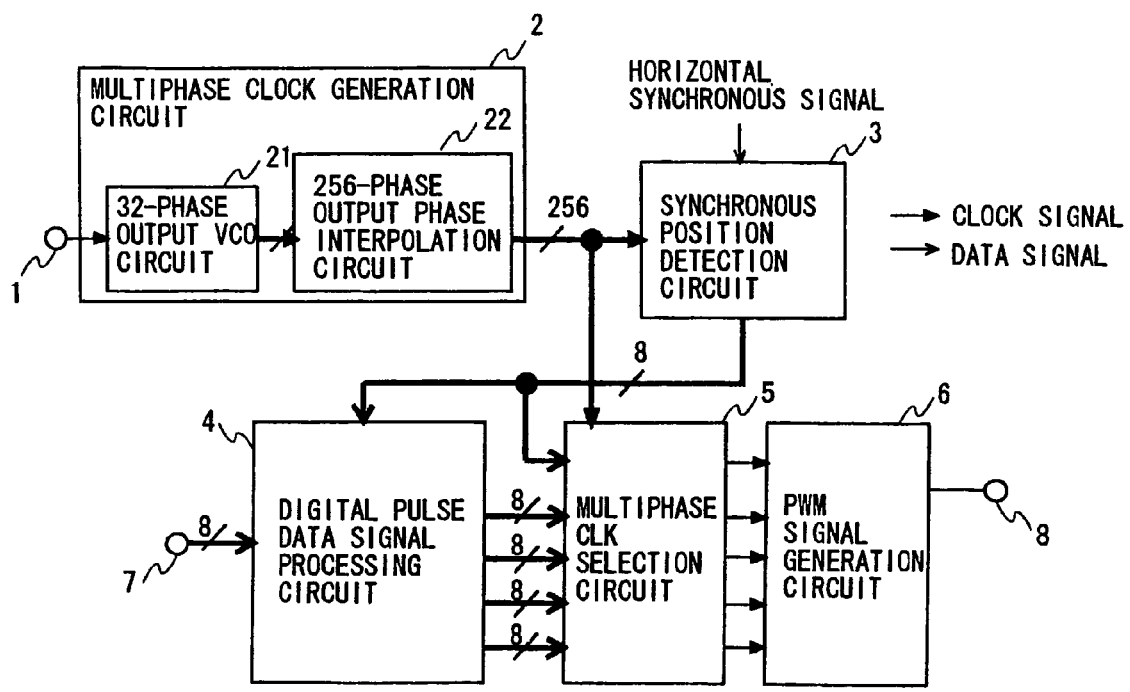
FIG. 1 is a block diagram showing a pulse width modulation circuit of the present invention.

A pulse width modulation circuit of the present invention is used for laser output modulation, for example. FIG. 1 shows the overall configuration of a pulse width modulation circuit of the invention. The pulse width modulation circuit includes a multiphase clock generation circuit 2, synchronous position detection circuit 3, digital pulse data signal processing circuit 4, multiphase clock (CLK) selection circuit 5, and pulse width modulation (PWM) signal generation circuit 6. The multiphase clock generation circuit 2 is connected to a reference clock input terminal 1, the synchronous position detection circuit 3, and the multiphase CLK selection circuit 5. The synchronous position detection circuit 3 is connected to the digital pulse data signal processing circuit 4 and the multiphase CLK selection circuit 5. The digital pulse data signal processing circuit 4 is connected to a digital pulse data input terminal 7 and the multiphase CLK selection circuit 5. The multiphase CLK selection circuit 5 is connected to the PWM signal generation circuit 6 and an output terminal 8.

A reference clock is input to the multiphase clock generation circuit 2 through the input terminal 1. The multiphase clock generation circuit 2 generates multiphase clock signals according to the input reference clock and outputs the signals to the synchronous position detection circuit 3 and the multiphase CLK selection circuit 5. In this invention, the multiphase clock generation circuit 2 generates multiphase clock signals by phase-interpolating intermediate clock signals generated by a phase lock loop circuit. The multiphase clock signals include 256 (=$2^8$) phases of clocks if a resolution is 8 bits. The multiphase clock generation circuit 2 of this embodiment includes a 32-phase output voltage-controlled oscillator (VCO) circuit 21 and a 256-phase output phase interpolation circuit 22.

The synchronous position detection circuit 3 receives the multiphase clock signals output from the multiphase clock generation circuit 2 and a horizontal synchronous signal which is a reference signal. The synchronous position detection circuit 3 detects which clock in the multiphase clock signals the horizontal synchronous signal is in synchronization with. A synchronous position detection signal indicating the detection result of the synchronous position is output to the digital pulse data signal processing circuit 4 and the multiphase CLK selection circuit 5.

The digital pulse data signal processing circuit 4 receives digital pulse data, which is input data, and the synchronous position detection signal output from the synchronous position detection circuit 3. The digital pulse data signal processing circuit 4 converts the input digital pulse data into PWM pulse rise information and fall information according to the synchronous position detection result in order to synchronize a PWM pulse with the horizontal synchronous signal. The signal containing the rise information and fall information is output to the multiphase CLK selection circuit 5.

For example, when outputting a PWM pulse in synchronization with CLKIP {200} in 256-phase clock CLKIP {255: 0}, if pulse data for outputting a PWM pulse with a cycle width of 100/256 to the center of cycle is input, rise information and fall information are calculated as follows:

Rise information={(256/2)−(100/2)+200}mod256=22

Fall information={(256/2)+(100/2)+ 200}mod256=122

In the above calculation, "mod" represents remainder of division.

This means that, when CLKIP {200} to {255} {0} to {200} makes one cycle, a PWM pulse which rises at CLKIP {22} and falls at CLKIP {122} is generated. An arithmetic circuit which implements this processing may be implemented easily by those skilled in the art using logic synthesis or the like, and it is not described here.

The multiphase CLK selection circuit 5 receives the multiphase clock signals output from the multiphase clock generation circuit 2, the synchronous position detection signal output from the synchronous position detection circuit 3, and the signal containing rise information and fall information output from the digital pulse data signal processing circuit 4. The multiphase CLK selection circuit 5 selects an arbitrary clock from the signal contained in the multiphase clock signals according to the rise information and fall information. The selected clock or selected clock signal is input to the PWM signal generation circuit 6.

The PWM signal generation circuit 6 receives the selected clock signal from the multiphase CLK selection circuit 5. The PWM signal generation circuit 6 generates a pulse width modulation signal or PWM pulse according to the selected clock signal. The pulse width modulation signal is a signal for modulating laser output, for example.

The configuration and operation of each circuit are described hereinafter in further detail.

Figure 2:
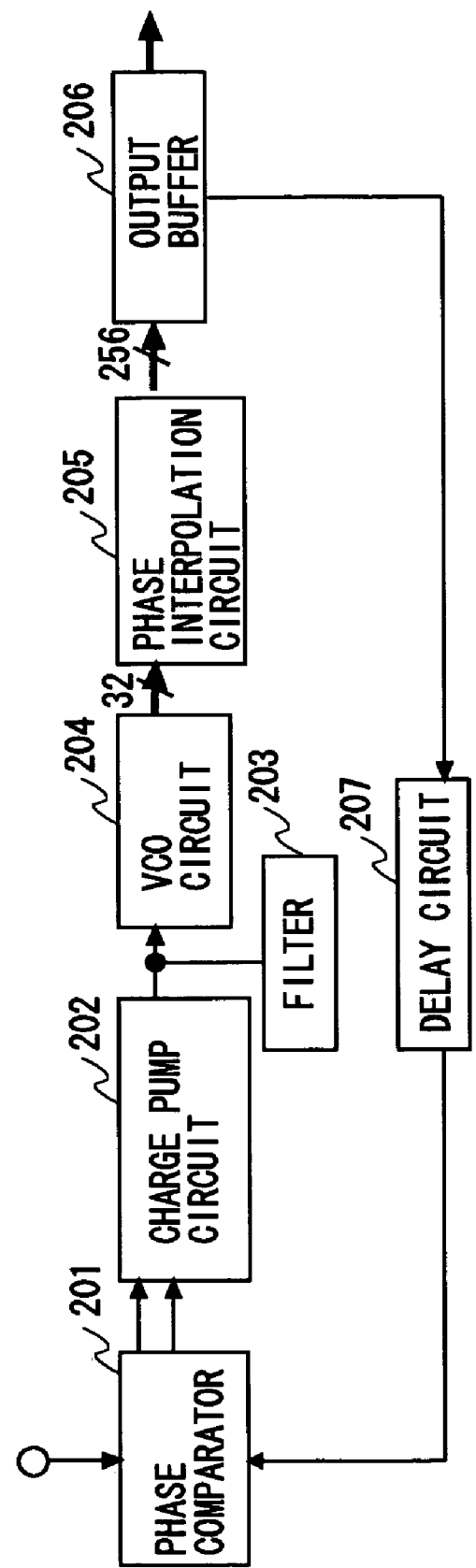
FIG. 2 is a block diagram showing a multiphase clock generation circuit of the present invention.

FIG. 2 shows a configuration example of the multiphase clock generation circuit 2. The multiphase clock generation circuit 2 of this invention uses a combination of a phase lock loop (PLL) circuit and a phase interpolation circuit as a means to generate multiphase clock signals. Use of only an oscillator of a PLL circuit to generate 256-phase clocks makes high-speed operation difficult. On the other hand, use of only a phase interpolation circuit to generate 256-phase clocks causes size increase and accuracy degradation due to manufacturing variation. This embodiment therefore uses the two circuits in combination.

The multiphase clock generation circuit 2 includes a phase comparator 201, charge pump circuit 202, filter 203, voltage controlled oscillator (VCO) circuit 204, phase interpolation circuit 205, output buffer 206, and delay circuit 207.

The phase comparator 201 receives a reference clock. It compares the phases of the reference clock and a signal input through the delay circuit 207 and generates phase difference pulse information. The charge pump circuit 202 converts the phase difference pulse information generated in the phase comparator 201 into current information.

The signal output from the charge pump circuit 202 is filtered by the filter 203 and then input to the VCO circuit 204. The VCO circuit 204 has an oscillating frequency which varies according to an input signal and generates an intermediate clock signal. In this example, it generates 32-phase intermediate clock signals. The VCO circuit 204 is composed of a ring oscillator where 32 stages of differential amplifiers are connected in series and the output of the final stage is inverted and input to the initial stage. The outputs of the 32 stages of differential amplifiers connected in series are 32-phase intermediate clock signals. This VCO circuit is disclosed in Japanese Patent No. 3512676.

The intermediate clock signals generated in the VCO circuit 204 are input to the phase interpolation circuit 205. The phase interpolation circuit 205 generates multiphase clock signals from the intermediate clock signals. This embodiment sequentially creates multiphase clock signals: from the 32-phase intermediate clock signals to 64-phase clock signals, then from the 64-phase clock signals to 128-phase clock signals, and finally from the 128-phase clock signals to 256-phase clock signals CLKIP {0} to CLKIP {255}.

The multiphase clock signals of 256 phases are output through the output buffer 206. Of the multiphase clock signals, the signal CLKIP {0} is fed back and input to the phase comparator 201 after being delayed by the delay circuit 207.

Figure 3:
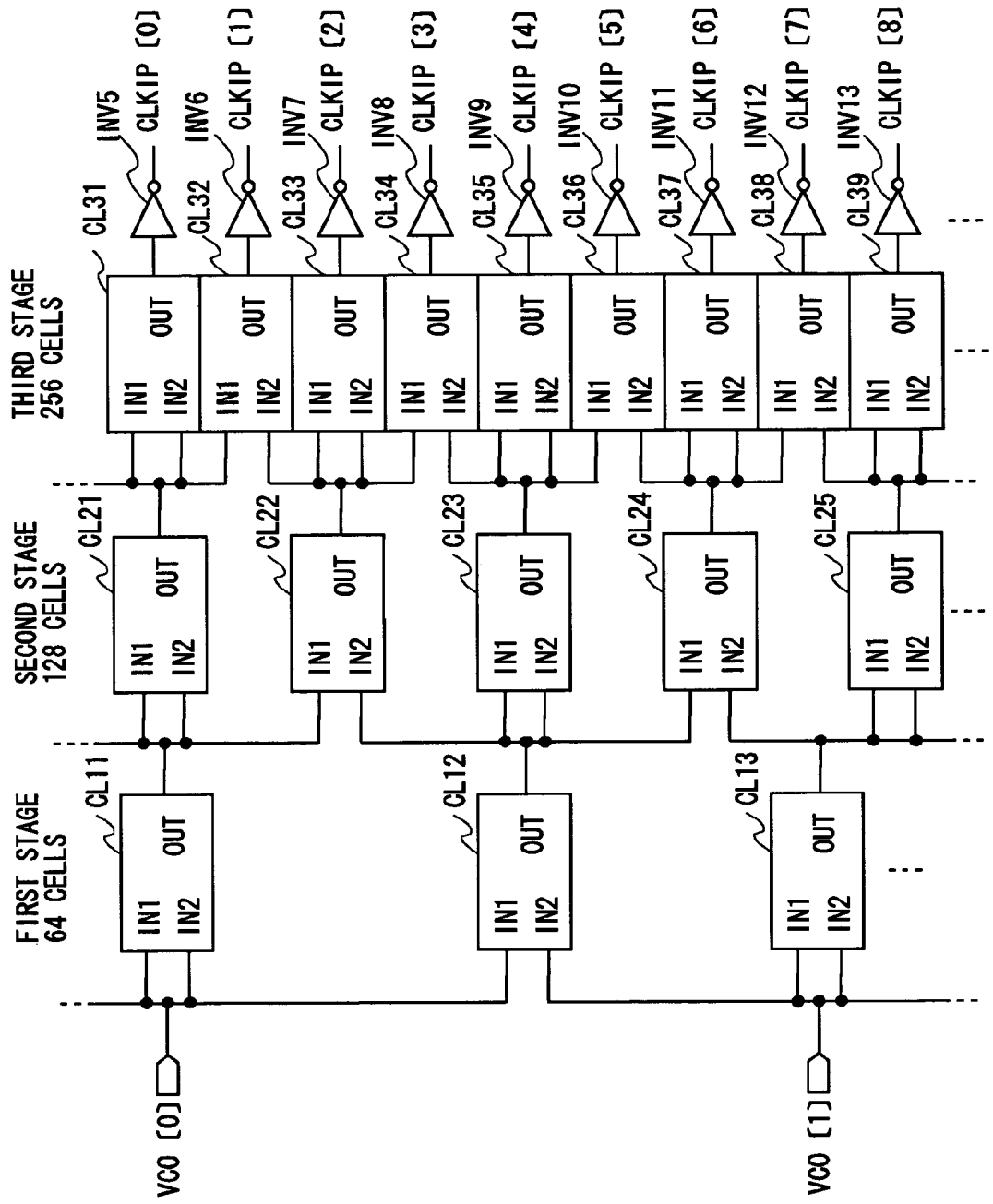
FIG. 3 is a circuit diagram showing a phase interpolation circuit of the present invention.

The configuration of the phase interpolation circuit 205 is detailed below. The phase interpolation circuit 205 is also called a timing difference dividing circuit or an interpolator. FIG. 3 shows the overall configuration of the phase interpolation circuit 205. The cells CL11 to CL39 of the phase interpolation circuit 205 each have the circuit configuration shown in FIG. 4.

The phase interpolation circuit 205 receives from the VCO circuit 204 the intermediate clock signals of 32 phases from VCO{0} to VCO{31}. The intermediate clock signals are clocks with a phase shifted by 1/32. VCO{0} is input to input terminals IN1 and IN2 of the cells CL10, CL11 and CL12. VCO{1} is input to input terminals IN1 and IN2 of the cells CL12, CL13 and CL14.

The intermediate clock signals of 32 phases VCO{0} to VCO{31} are thereby input to the input terminals IN1 and IN2 of 64 cells. The 64 cells in the first stage generate 64 phases of clock signals. Similarly, the 64 phase clock signals input to the 128 cells in the second stage are converted into 128 phases of clock signals by phase interpolation. The 128 phase clock signals input to the 256 cells in the third stage are converted into 256 phases of clock signals by phase interpolation.

Thus, the multiphase clock signals CLKIP{0} to CLKIP{255} output finally include clocks with a phase shifted by 1/256 after three-time phase interpolation of 32 phase shift. In this embodiment, the signals phase-interpolated three times are input to inverters INV so that an edge interpolated at a signal fall is changed to a signal rise.

Figure 4:
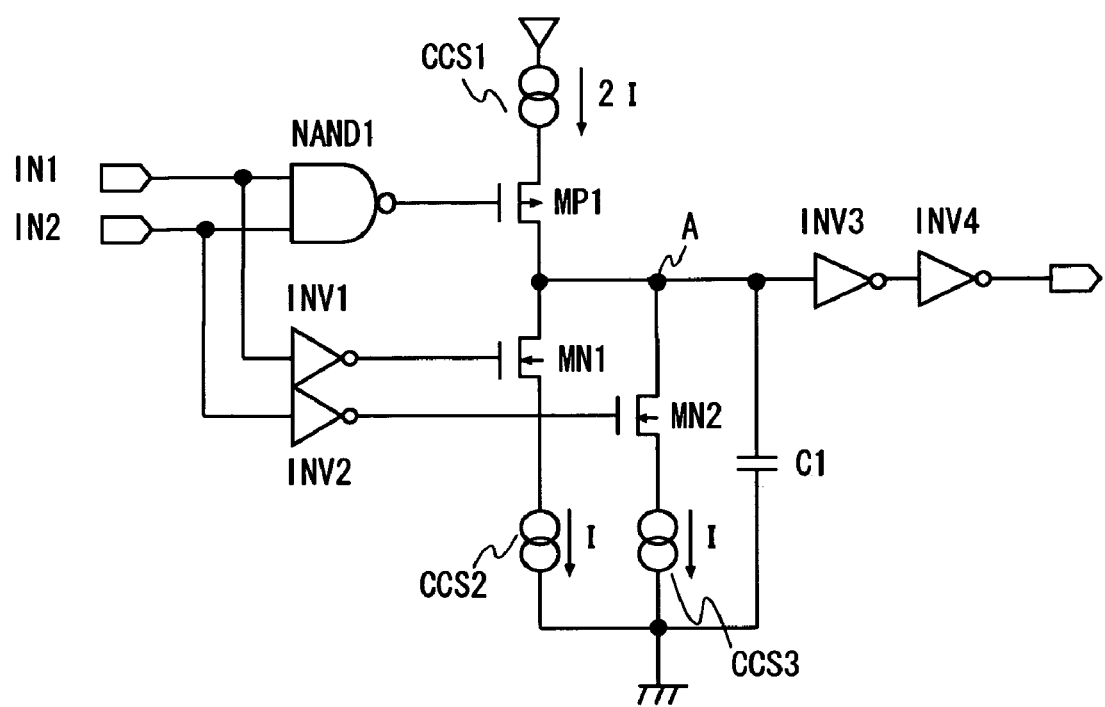
FIG. 4 is a circuit diagram showing one cell of a phase interpolation circuit of the present invention.

The configuration of each cell is described in further detail with reference to FIG. 4. In this embodiment, a logic circuit is composed of a NAND circuit NAND1 to which inputs IN1 and IN2 are input, an inverter INV1 to which IN1 is input, and an inverter INV2 to which IN2 is input. The output of the NAND1 is connected to the gate of a P-channel MOS transistor MP1. The output of the INV1 is connected to the gate of an N-channel MOS transistor MN1. The output of the INV2 is connected to the gate of an N-channel MOS transistor MN2.

The source of the P-channel MOS transistor MP1 is connected to a constant current source CCS1, and the drain is connected to a node A and the drain of the N-channel MOS transistor MN1. The constant current source CCS1 is connected to a power supply terminal and has a current value 2I. The source of the N-channel MOS transistor MN1 is connected to a constant current source CCS2. The drain of the N-channel MOS transistor MN2 is connected to the node A and the source is connected to a constant current source CCS3. The constant current sources CCS2 and CCS3 have the same current value I, which is half the current value of the CCS1. A capacitor C1 is connected between the node A and a ground terminal. The input terminal of the inverter INV3 is connected to the node A, and the output terminal is connected to the input terminal of the inverter INV4. The output terminal of the inverter INV4 is connected to an output terminal OUT of the cell.

In the cell having such a circuit configuration, the current I is variable in the range of oscillating frequency of the VCO circuit 204, thereby allowing accurate interpolation at half an input phase difference within use frequency. The interpolation is performed in the falling edge of the inputs IN1 and IN2.

Figure 5:
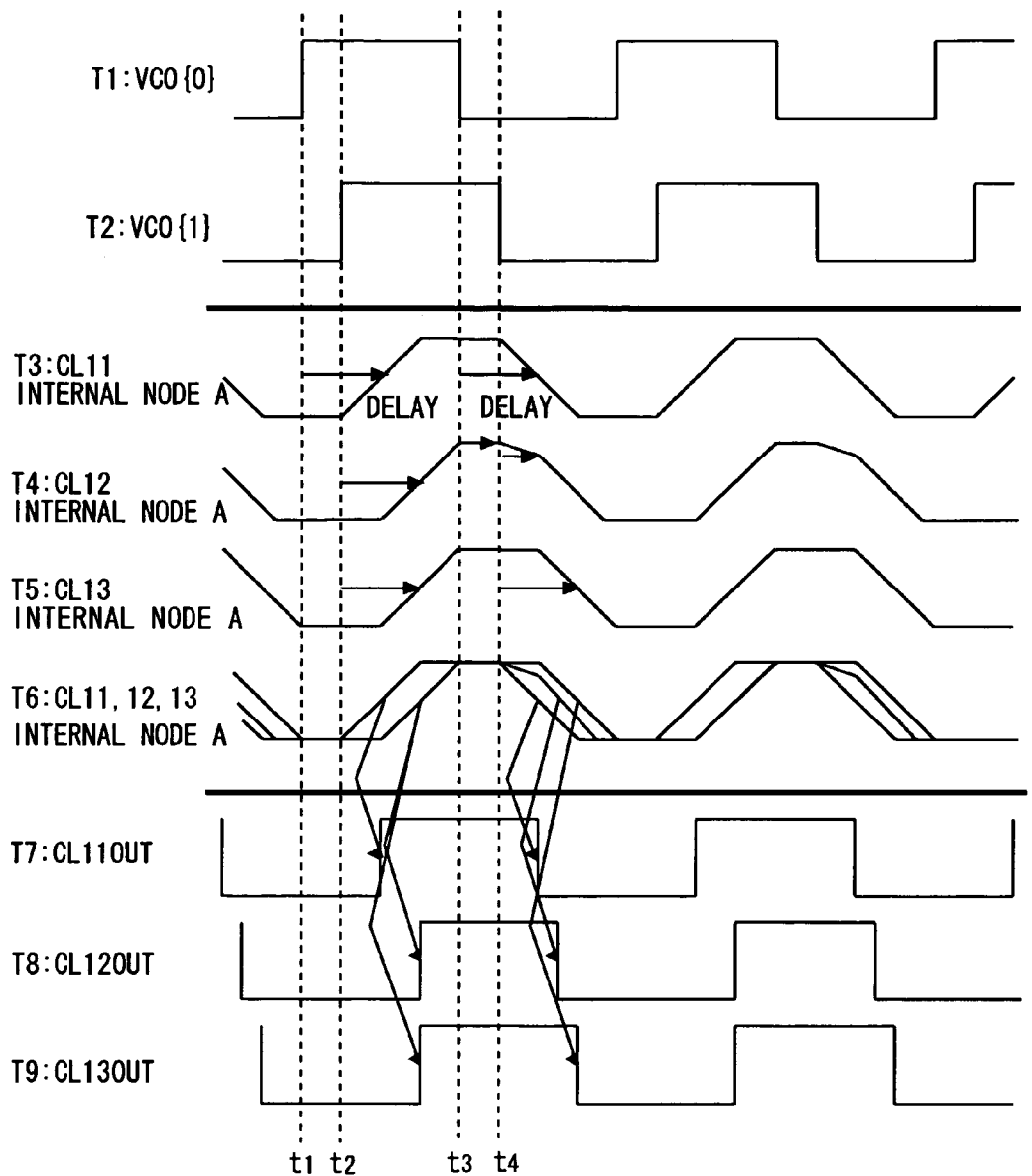
FIG. 5 is a timing chart showing the operation of a phase interpolation circuit of the present invention.

The interpolation operation in the first stage of the phase interpolation circuit 205 shown in FIG. 3 is described hereinafter with reference to the timing chart of FIG. 5. A pulse shown in T1 in FIG. 5 is input from VCO{0} to the inputs IN1 and IN2 of the cell CL11 and the input IN1 of the cell CL12. The pulse from VCO{0} rises at time t1 and falls at time t3. Further, a pulse shown in T2 in FIG. 5 is input from VCO{1} to the input IN2 of the cell CL12 and the inputs IN1 and IN2 of the cell CL13. The pulse from VCO{1} rises at time t2 and falls at time t4.

In the node A of the cell CL11, an edge is created with a current 2I for VCO{0} as shown in T3 in FIG. 5. In the node A of the cell CL12, upon falling of VCO{0}, a pulse first starts falling with a current I and then, upon falling of VCO{1}, the current becomes 2I and the pulse falls at a double tilt angle as shown in T4 in FIG. 5. In the node A of the cell CL13, an edge is created with a current 2I for VCI{1} as shown in T5 in FIG. 5. In the output terminal of the cell CL11, a pulse having rise and fall corresponding to the edge in the node A is created and output as shown in T7 in FIG. 5. Similarly, in the output terminal of the cell CL12, a pulse having rise and fall corresponding to the edge in the node A is created and output as shown in T8 in FIG. 5. Further, in the output terminal of the cell CL13, a pulse having rise and fall corresponding to the edge in the node A is created and output as shown in T9 in FIG. 5. In this way, the phase of the falling edge of the pulse output from the cell CL12 is intermediate between those of the pulses output from the cell CL11 and CL13.

Figure 6:
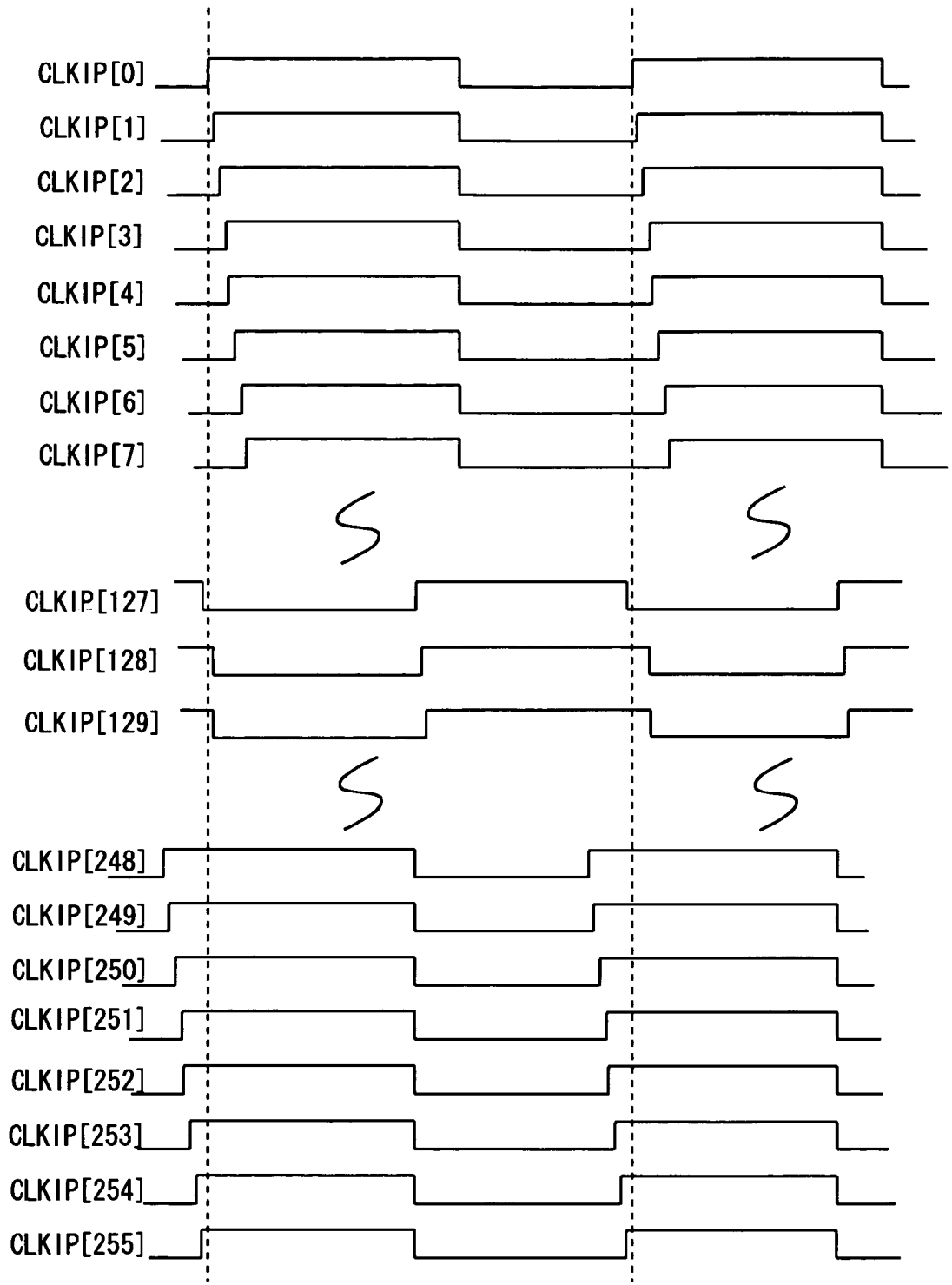
FIG. 6 is a signal waveform diagram showing multiphase clock signals output from a multiphase clock generation circuit of the present invention.

FIG. 6 shows the waveform of multiphase clock signals output from the multiphase clock generation circuit 2. Within one cycle defined by the dotted lines, signals with 256 different rising edge phases are output. Since this embodiment repeats phase interpolation three times, 32 groups of signals, each having 8 signals with the same falling edge, are output.

Figure 7:
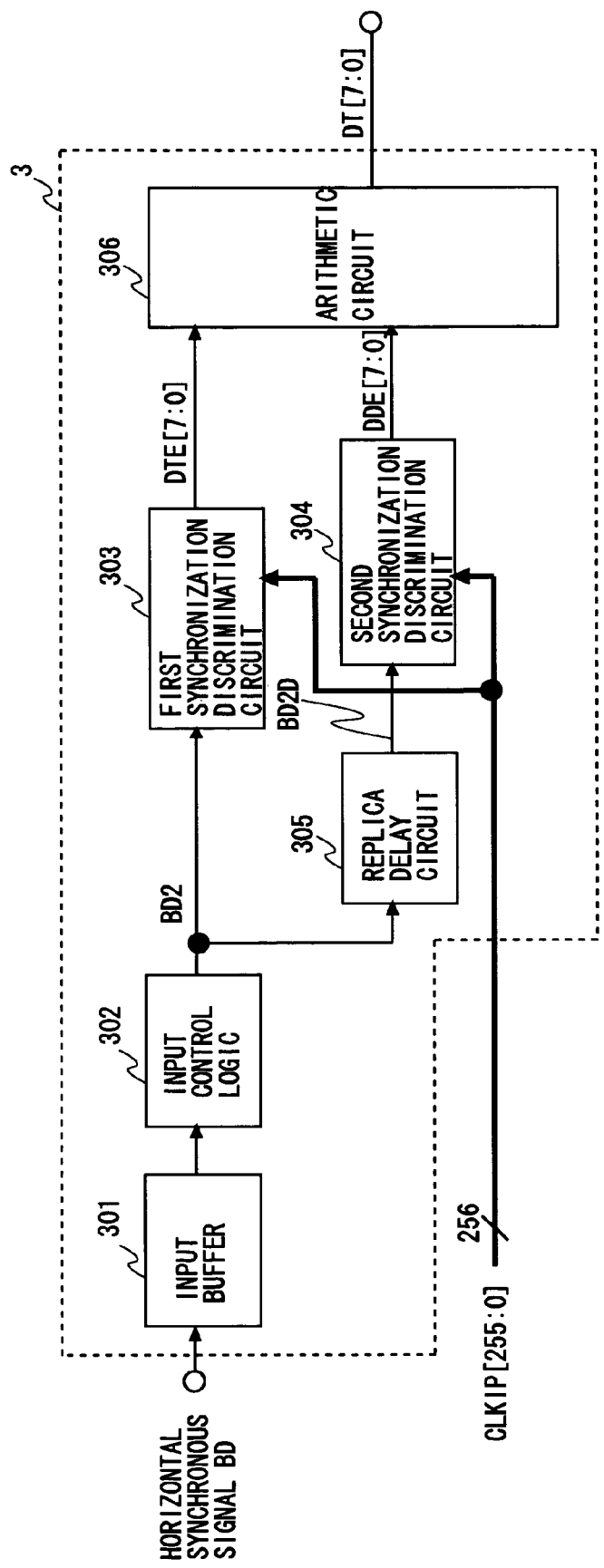
FIG. 7 is a block diagram showing a synchronous position detection circuit of the present invention.

Now, a configuration example of a synchronous position detection circuit is described hereinafter with reference to FIG. 7. The synchronous position detection circuit 3 has two different synchronization discrimination circuits for discriminating the synchronization of multiphase clock signals and a horizontal synchronous signal. Each synchronization discrimination circuit discriminates whether each multiphase clock signal is in synchronization with a horizontal synchronous signal. One synchronization discrimination circuit receives a horizontal synchronous signal delayed by a replica delay circuit. From the discrimination result of each synchronization discrimination circuit, a clock signal to be selected from the multiphase clock signals can be determined by arithmetic processing.

The synchronous position detection circuit 3 includes a first synchronization discrimination circuit 303 and a second synchronization discrimination circuit 304. The first and the second synchronization discrimination circuits 303 and 304 compare the phases of the input multiphase clock signal and the horizontal synchronous signal and select the clock signal which has the closest phase to the horizontal synchronous signal or the clock signal synchronized with the horizontal synchronous signal. The second synchronization discrimination circuit 304 receives a horizontal synchronous signal BD2D delayed by a replica delay circuit 305. The delay in the replica delay circuit 305 compensates the delay in each internal circuit.

The first and the second synchronization discrimination circuits 303 and 304 output suffix for specifying the selected clock signal. In this embodiment, the suffix is indicated by 8-bit data. The first synchronization discrimination circuit 303 outputs suffix DTE, and the second synchronization discrimination circuit 304 outputs suffix DDE. An arithmetic circuit 306 determines a clock signal to be selected from the multiphase clock signals according to the output signals of the first and the second synchronization discrimination circuits 303 and 304 and outputs suffix DT which specifies the clock signal to the multiphase CLK selection circuit 5.

The overall operation of the synchronous position detection circuit 3 is described below. The horizontal synchronous signal BD from outside is input to the first synchronization discrimination circuit 303 through an input buffer 301 and an input control logic 302. The horizontal synchronous signal which is delayed by the input buffer 301 and the input control logic 302 is indicated by the symbol BD2. The delayed horizontal synchronous signal BD2 is divided and input to the replica delay circuit 305. The horizontal synchronous signal BD2D which is delayed by the replica delay circuit 305 is then input to the second synchronization discrimination circuit 304.

The first synchronization discrimination circuit 303 receives multiphase clock signals CLKIP and selects a clock signal synchronized with the horizontal synchronous signal BD2 from the multiphase clock signals CLKIP. Then, it outputs suffix DTE of the selected clock signal to the arithmetic circuit 306.

Figure 8:
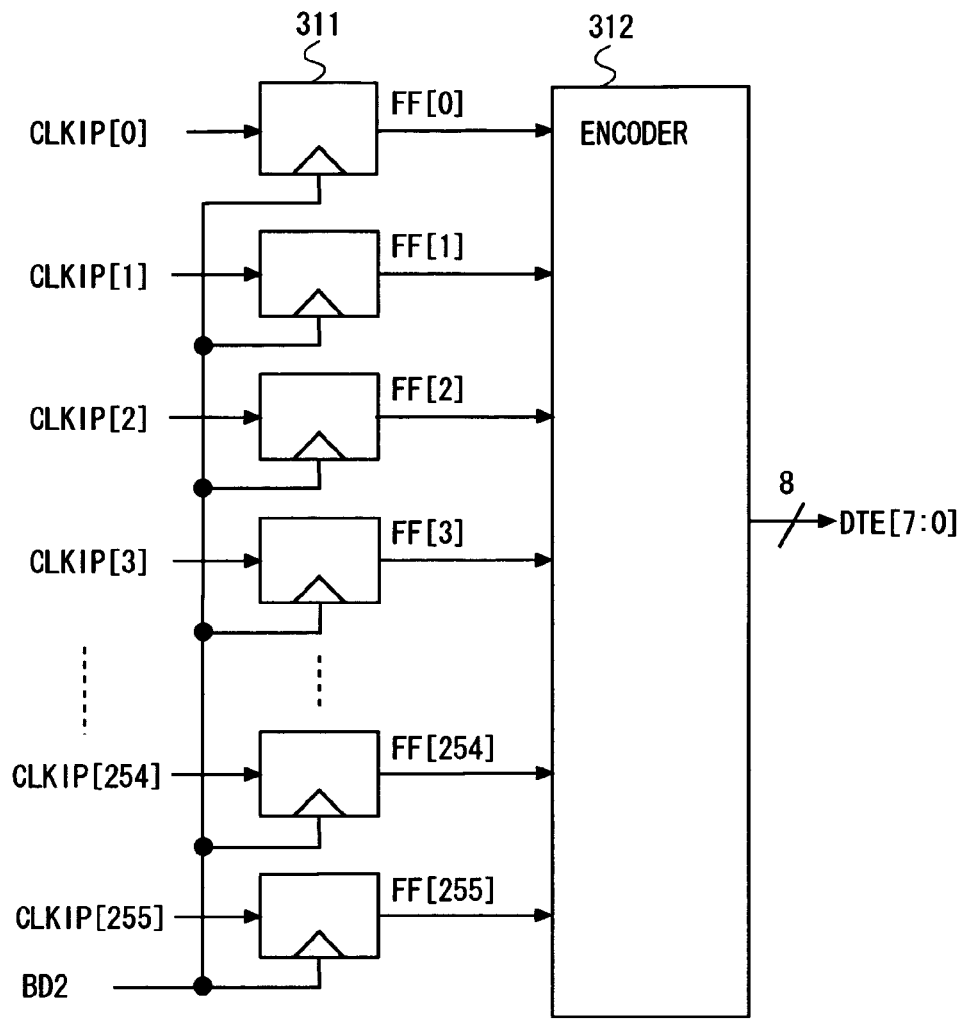
FIG. 8 is a block diagram showing a configuration example of a first synchronization determination circuit of the present invention.

FIG. 8 shows a configuration example of the first synchronization discrimination circuit 303. The first synchronization discrimination circuit 303 includes a flip-flop group 311 consisting of a plurality of (256 in this embodiment) flip-flops, and an encoder 312 for generating an 8-bit signal DTE according to output signals FF from the flip-flop group 311. Each flip-flop of the flip-flop group 311 receives each multiphase clock signal CLKIP and a reference signal BD2 as a clock signal. The output signals FF of the flip-flop group 311 change at the rising edge of the BD2. The flip-flop which has received a multiphase clock signal CLKIP whose phase is the same as or synchronized with the reference signal BD2 outputs "H". The flip-flop subsequent to the flip-flop outputting "H" outputs "L". In this way, the bit pattern of "H", "L" is generated by the output signals of the flip-flop receiving the clock signal synchronized with the reference signal BD2 and the subsequent flip-flop. The encoder 312 detects this bit pattern, determines which clock signal has a synchronized phase with the reference signal BD2, and encodes the result into 8-bit data. In this embodiment, the encoder 312 discriminates the synchronous clock signal by detecting a bit pattern of 9 bits or more. Specifically, it discriminates the synchronization by detecting the 9 bit pattern "H, H, H, H, H, H, H, H, L". Alternatively, it may discriminate the synchronization by bits which are 9 bits or more apart and 4 or more successive bits. This is because synchronization determination with 8 bits or less fails to discriminate synchronization accurately since the phase interpolation circuit 22 outputs 8 signals with the same falling edge all together, causing the circuit to operate improperly.

The second synchronization discrimination circuit 304 also receives multiphase clock signals CLKIP and discriminates the clock signal synchronized with the horizontal synchronous signal BD2D from the multiphase clock signals CLKIP. Then, the second synchronization discrimination circuit 304 outputs suffix DDE of the selected clock signal to the arithmetic circuit 306.

The arithmetic circuit 306 determines a clock signal to be selected from the multiphase clock signals CLKIP according to DTE and DDE. It then outputs suffix DT of the determined clock signal to the multiphase CLK selection circuit 5.

Figure 9:
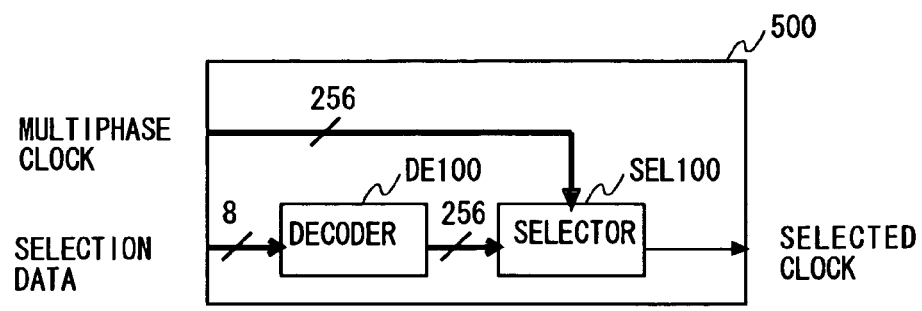
FIG. 9 is a block diagram showing a configuration example of a conventional multiphase clock selection circuit.
Figure 10:
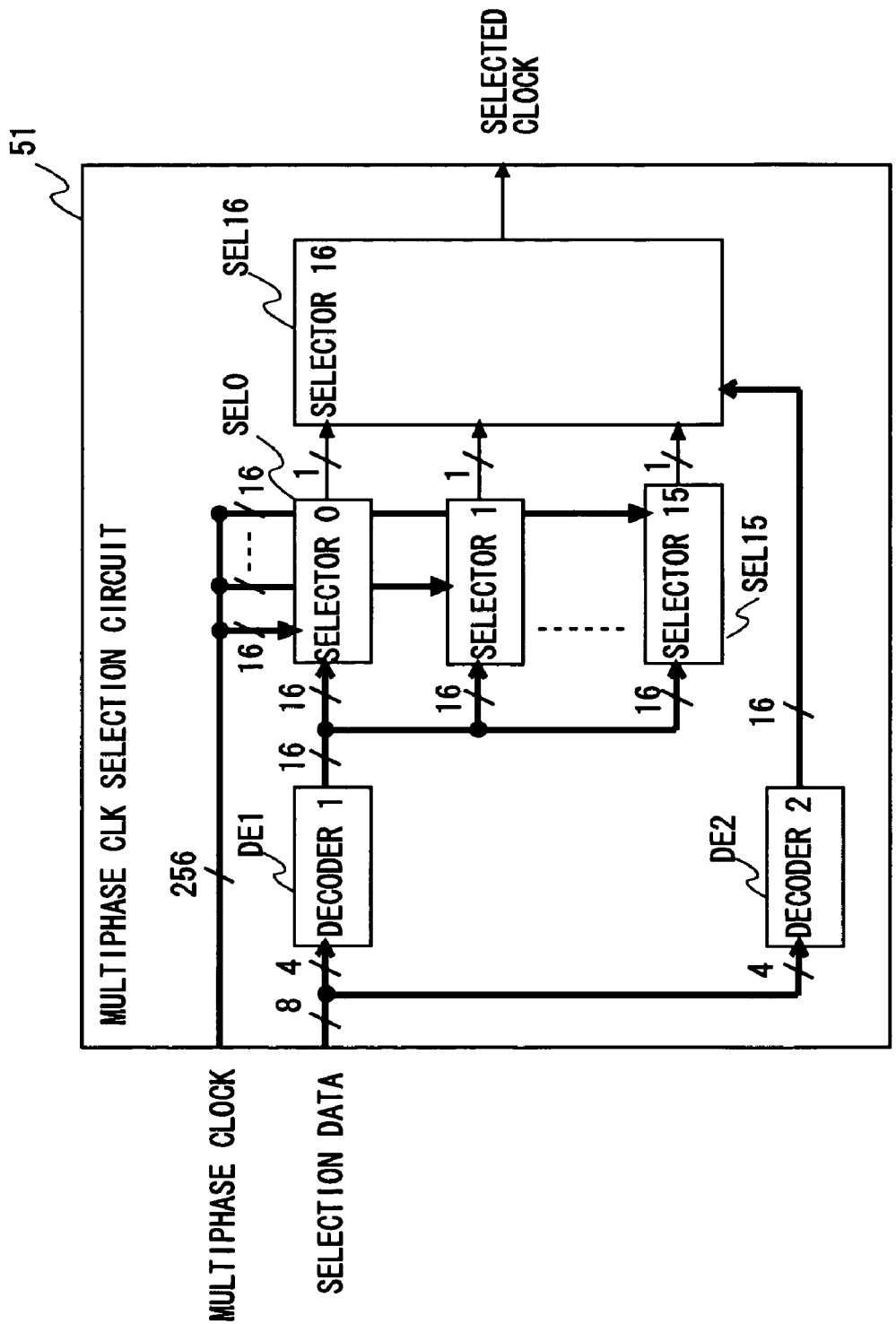
FIG. 10 is a block diagram showing one multiphase clock selection circuit of the present invention.

The multiphase CLK selection circuit 5 is described below. The multiphase CLK selection circuit 5 of this invention is not a simple selector as shown in FIG. 9 but is composed of a decoder which separates and decodes lower 4 bits and upper 4 bits and a high-speed selector which selects one from 16 as shown in FIG. 10. Further, the multiphase CLK selection circuit 5 has selection circuits corresponding to rise information and fall information and a selection circuit for interleave processing. Thus, it is composed of total five multiphase clock selection circuits.

The multiphase clock selection circuit of this invention includes a decoder DE1 to which lower 4 bits of 8-bit selection data is input and a decoder DE2 to which upper 4 bits are input. The decoder DE1 decodes the lower 4 bits of the selection data into 16 outputs. The decoder DE2 decodes the upper 4 bits of the selection data into 16 outputs. Thus, the number of output signals of the decodes DE1 and DE2 is 32 in total.

The multiphase clock signals of 256 phases are divided into every 16 bits and input to each of 16 selectors SEL0 to SEL15. Each selector SEL0 to SEL15 also receives 16-bit output data from the decoder DE1. Each selector SEL0 to SEL15 outputs the multiphase clock signal with corresponding input data to the selector SEL16. Thus, the selectors SEL0 to SEL15 selects 16 from 256 multiphase clocks and inputs them to the selector SEL16.

The selector SEL16 receives total 16 selected clocks from the selectors SEL0 to SEL15. The selector SEL16 also receives 16-bit output data from the decoder DE2 at the same time. Then, the selector SEL16 selects one from the input 16 selected clocks according to the output data from the decoder DE2. In this way, one clock is selected from 256 multiphase clocks.

Figure 11:
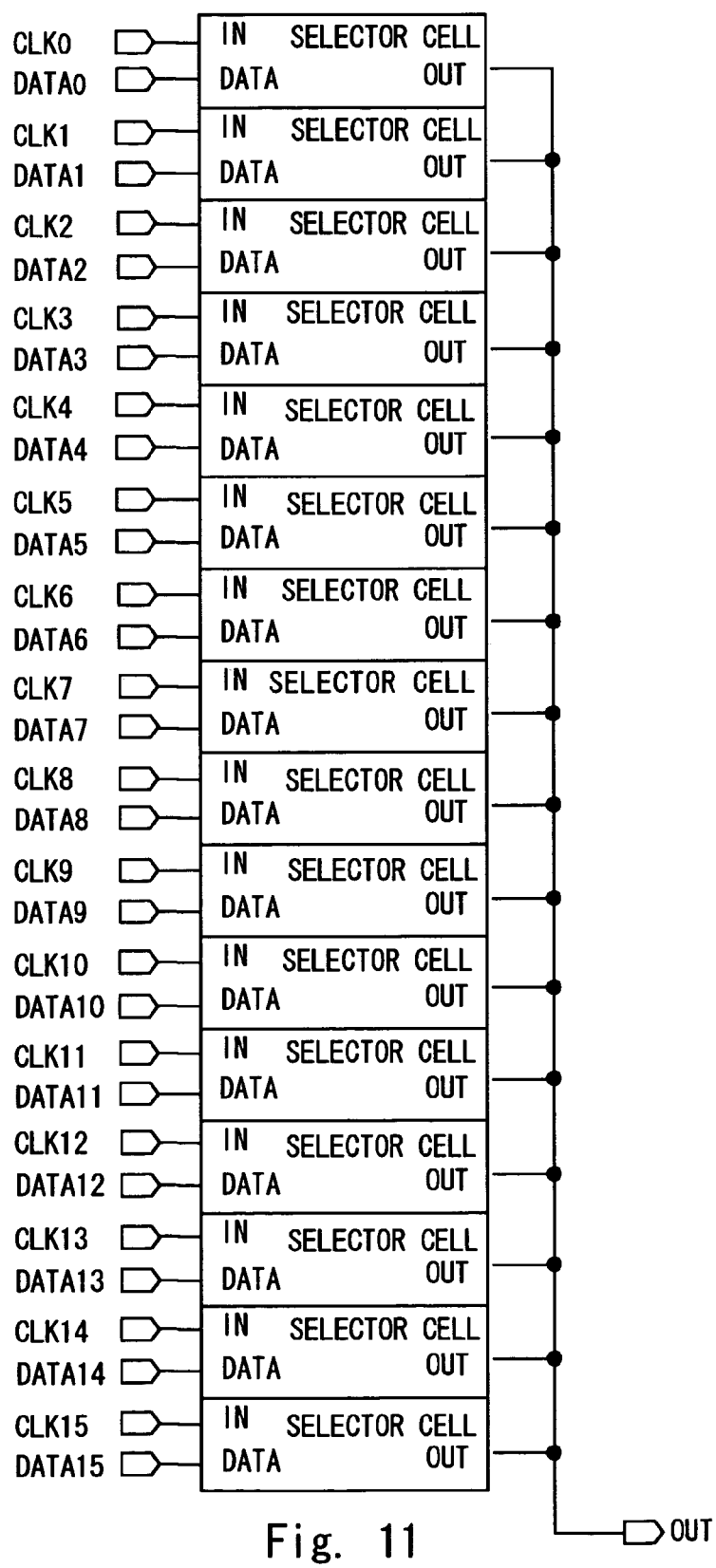
FIG. 11 is a circuit diagram showing the overall configuration of a selector in a multiphase clock selection circuit of the present invention.

FIG. 11 shows the configuration of the internal circuit of the selectors SEL0 to SEL15. Inverted selection data is also generated and used. The signal selected is always one, and the cells not selected have high impedance outputs, which allows bundling the outputs to achieve high-speed operation. Further, the whole multiphase clock selector divides the selection data into every 4 bits and makes 2-stage structure of the selector SEL0 to SEL15 and the selector SEL16 so as to achieve high-speed operation.

Figure 12:
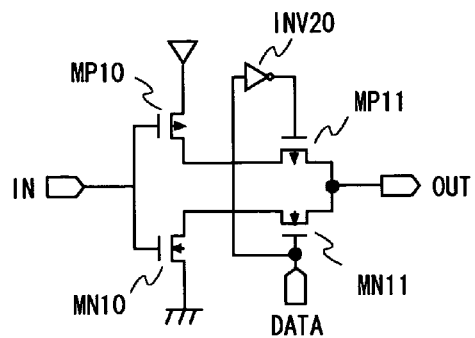
FIG. 12 is a circuit diagram showing a configuration of one cell of a selector in a multiphase clock selection circuit of the present invention.

FIG. 12 shows a detailed circuit configuration of a selector cell. An input IN is connected to the gate of the P-channel MOS transistor MP10 and the gate of the N-channel MOS transistor MN10. The source of the P-channel MOS transistor MP10 is connected to a power supply terminal. The source of the N-channel MOS transistor MN10 is connected to a ground terminal. The drain of the P-channel MOS transistor MP10 is connected to the source of a P-channel MOS transistor MP11. The gate of the P-channel MOS transistor MP11 receives an inverted signal of A inverted by an inverter INV20. The drain of the N-channel MOS transistor MN10 is connected to the source of an N-channel MOS transistor MN11 whose gate receives the signal A. The drain of the P-channel MOS transistor MP11 and the drain of the N-channel MOS transistor MN11 are connected to an output terminal OUT. Thus, the signal A and the inverted signal of A inverted by an inverter INV20 serve as a switch so as to select whether the signal input to the input terminal IN is output to the output terminal OUT or the output of the output terminal OUT becomes high-impedance.

Figure 13:
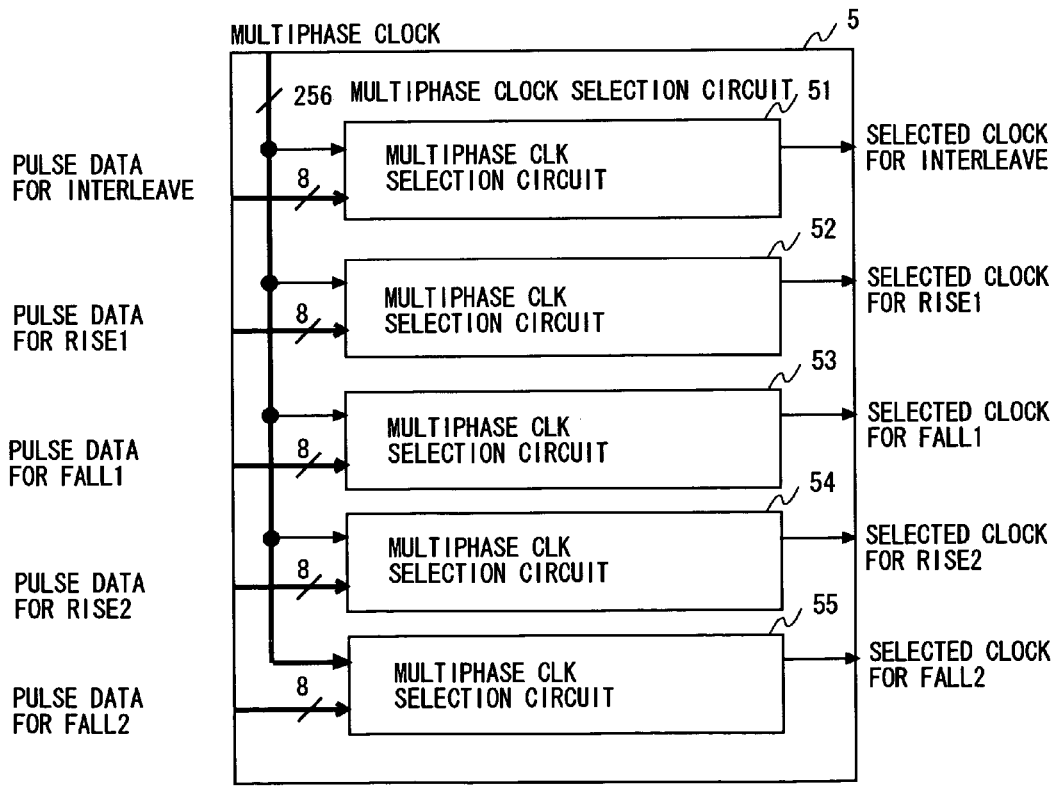
FIG. 13 is a block diagram showing a multiphase clock selection circuit of the present invention.

As shown in FIG. 13, the pulse width modulation circuit of this embodiment includes total five multiphase clock selection circuits similar to the multiphase CLK selection circuit 51 shown in FIG. 10 in order to perform interleave operation.

A multiphase CLK selection circuit 51 receives 256 multiphase clock signals and 8-bit pulse data for interleaving. It selects and outputs one clock signal for interleaving from the 256 multiphase clock signals according to the pulse data for interleaving.

A multiphase CLK selection circuit 52 receives 256 multiphase clock signals and 8-bit pulse data for Rise1. It selects and outputs one clock signal for Rise1 from the 256 multiphase clock signals according to the pulse data for Rise1. The Rise1 indicates rise of one group of signal clocks divided into two groups for interleaving processing. Fall 1 indicates fall of the same group as the Rise1. Similarly, Rise2 indicates rise of the other group and Fall2 indicates fall of the same group as the Rise2.

A multiphase CLK selection circuit 53 receives 256 multiphase clock signals and 8-bit pulse data for Fall1. It selects and outputs one clock signal for Fall1 from the 256 multiphase clock signals according to the pulse data for Fall1.

A multiphase CLK selection circuit 54 receives 256 multiphase clock signals and 8-bit pulse data for Rise2. It selects and outputs one clock signal for Rise2 from the 256 multiphase clock signals according to the pulse data for Rise2.

A multiphase CLK selection circuit 55 receives 256 multiphase clock signals and 8-bit pulse data for Fall2. It selects and outputs one clock signal for Fall2 from the 256 multiphase clock signals according to the pulse data for Fall2.

The PWM signal generation circuit 6 is described in detail below. The PWM signal generation circuit 6 generates a PWM pulse from the clock selected by the multiphase clock selection circuit. Basically, it may be implemented by a simple logic circuit having a flip-flop F/F and an XOR circuit.

Figures 14, 16:
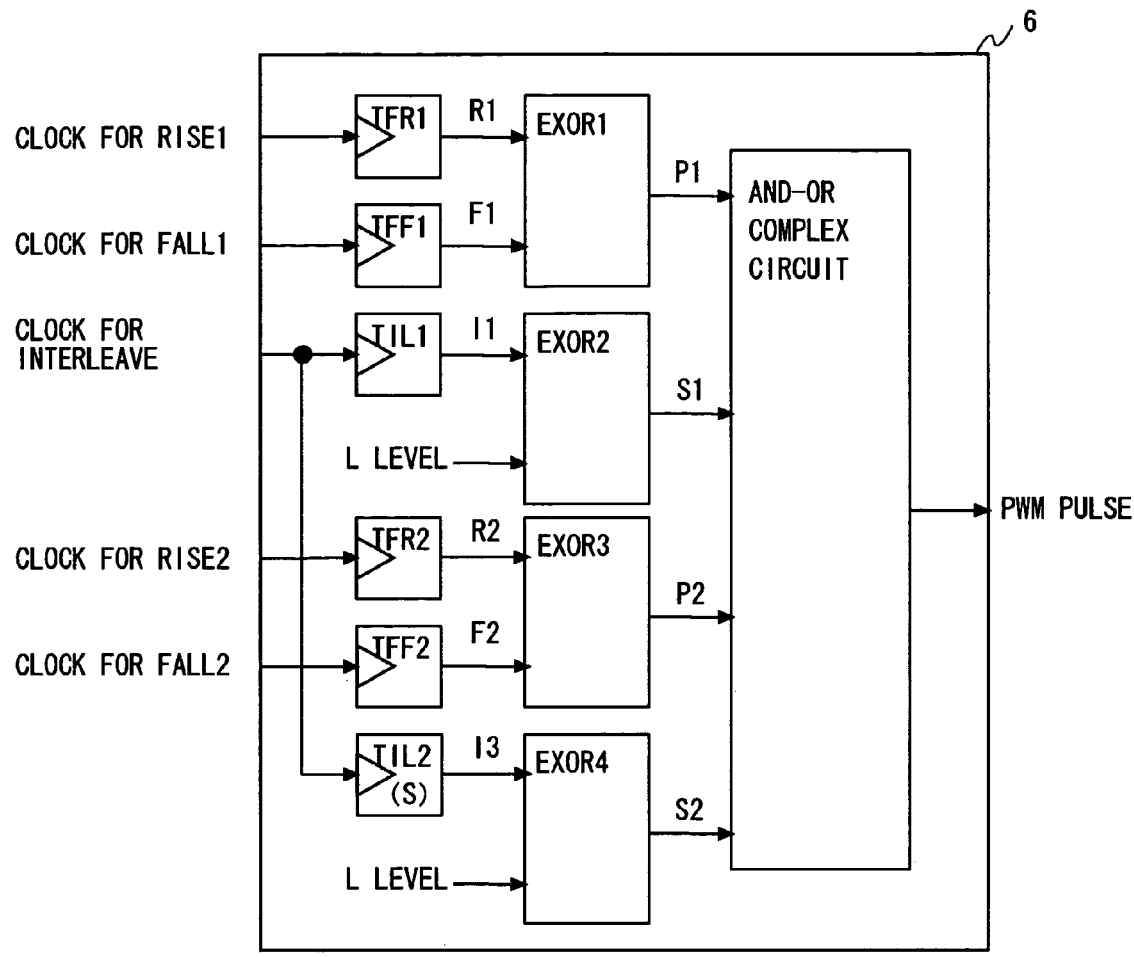
FIG. 14 is a block diagram showing a pulse width modulation signal generation circuit of the present invention.
FIG. 16 is a truth table of an AND-OR complex gate circuit included in a pulse width modulation signal generation circuit of the present invention.
Figure 15:
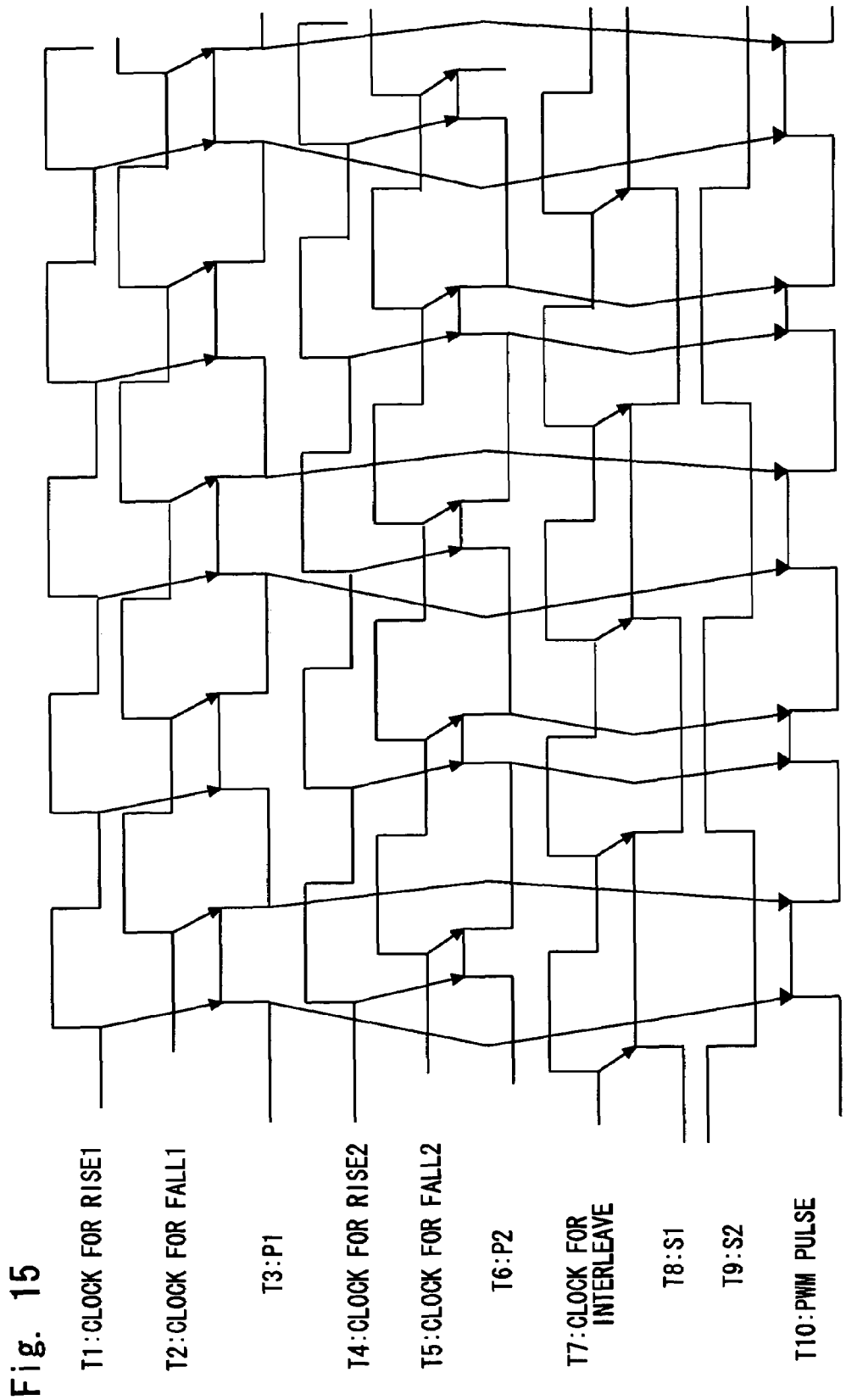
FIG. 15 is a timing chart showing the operation of a pulse width modulation signal generation circuit of the present invention.

The PWM signal generation circuit 6 has a circuit configuration as shown in FIG. 14, for example. FIG. 15 is a timing chart in the PWM signal generation circuit 6. The PWM signal generation circuit 6 includes six toggle flip-flops TFR1, TFF1, TIL1, TFR2, TFF2 and TIL2, four exclusive OR circuits EXOR1, EXOR2, EXOR3 and EXOR4, and an AND-OR complex gate circuit. The AND-OR complex gate circuit operates according to the truth table shown in FIG. 16.

The toggle flip-flop TFR1 receives a clock signal for Rise1 (T1 in FIG. 15) output from the multiphase CLK selection circuit 5. The output signal R1 of the toggle flip-flop TFR1 is input to the exclusive OR circuit EXOR1. The toggle flip-flop TFF1 receives a clock signal for Fall1 (T2 in FIG. 15) output from the multiphase CLK selection circuit 5, and its output signal F1 is input to the exclusive OR circuit EXOR1. The toggle flip-flop TIL1 receives a clock signal for interleaving (T7 in FIG. 15) output from the multiphase CLK selection circuit 5, and its output signal I1 is input to the exclusive OR circuit EXOR2. The other input of the exclusive OR circuit EXOR2 receives an L-level signal. The toggle flip-flop TFR2 receives a clock signal for Rise2 (T4 in FIG. 15) output from the multiphase CLK selection circuit 5, and its output signal R2 is input to the exclusive OR circuit EXOR3. The toggle flip-flop TFF2 receives a clock signal for Fall2 (T5 in FIG. 15) output from the multiphase CLK selection circuit 5, and its output signal F2 is input to the exclusive OR circuit EXOR3. The toggle flip-flop TIL2 receives a clock signal for interleaving (T7 in FIG. 15) output from the multiphase CLK selection circuit 5, and its output signal I2 is input to the exclusive OR circuit EXOR4. The other input of the exclusive OR circuit EXOR4 receives an L-level signal.

An output signal P1 (T3 in FIG. 15) of the exclusive OR circuit EXOR1, an output signal S1 (T8 in FIG. 15) of the exclusive OR circuit EXOR2, an output signal P2 (T6 in FIG. 15) of the exclusive OR circuit EXOR3, and an output signal S2 (T9 in FIG. 15) of the exclusive OR circuit EXOR4 are input to the AND-OR complex gate circuit. The AND-OR complex gate circuit generates and outputs a PWM pulse signal (T10 in FIG. 15).

Figure 17:
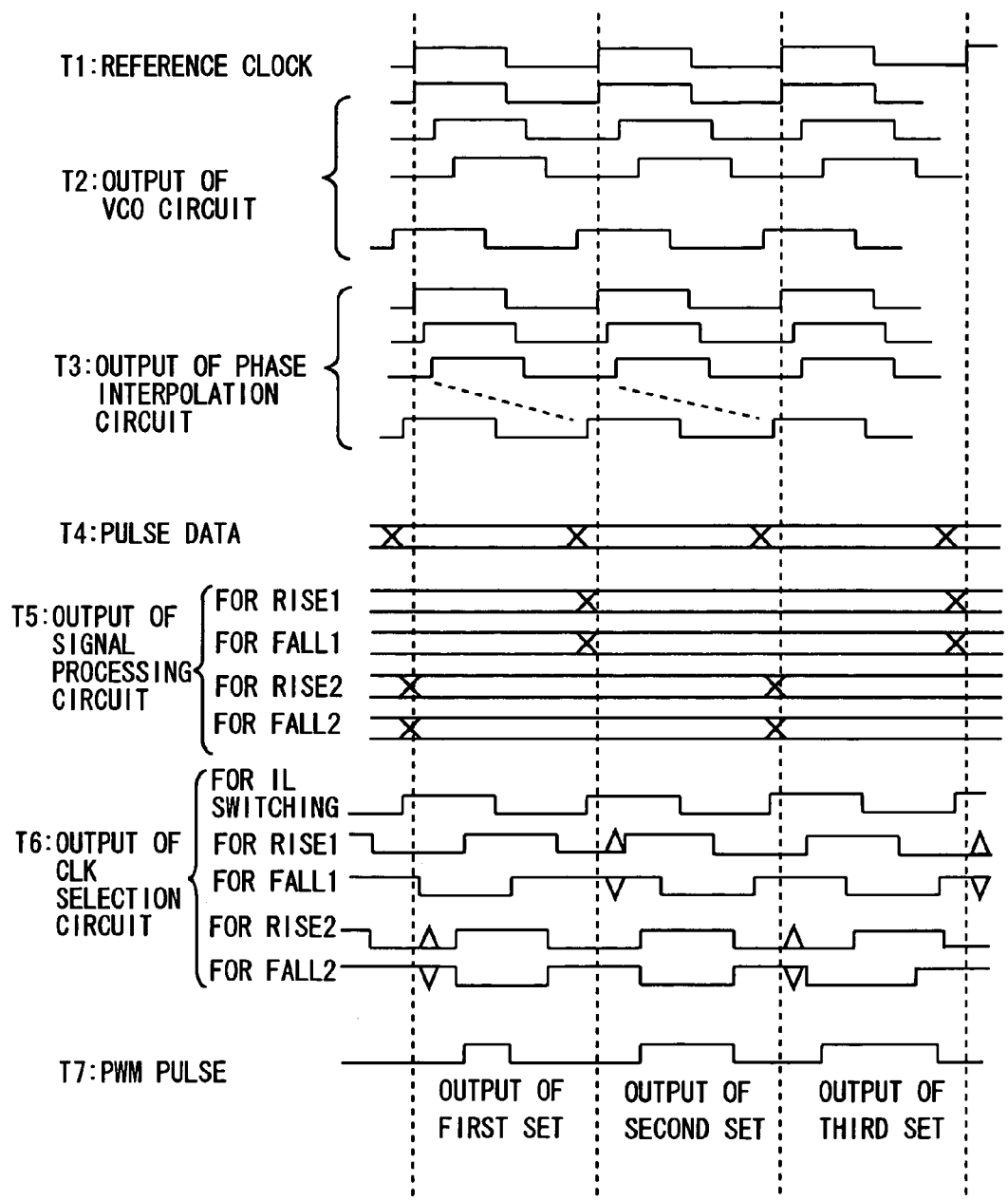
FIG. 17 is a timing chart showing the entire operation of a pulse width modulation signal generation circuit of the present invention.

The overall operation of the pulse width modulation circuit of this embodiment is described hereinafter with reference to the flowchart of FIG. 17.

Upon input of a reference clock (T1 in FIG. 17), the multiphase clock generation circuit 2 generates 256-phase multiphase clock signals according to the input reference clock. Specifically, in the multiphase clock generation circuit 2, the VCO circuit 21 generates 32-phase clock signals (T2 in FIG. 17) and inputs them to the phase interpolation circuit 22. The phase interpolation circuit 22 performs interpolating operation according to the 32-phase clock signals and generates 256-phase multiphase clock signals (T3 in FIG. 17). The multiphase clock signals generated in the multiphase clock generation circuit 2 are then input to the synchronous position detection circuit 3 and the multiphase CLK selection circuit 5.

The digital pulse data signal processing circuit 4 receives digital pulse data (T4 in FIG. 17) which is input data and a synchronous position detection signal output from the synchronous position detection circuit 3. The digital pulse data signal processing circuit 4 converts the input digital pulse data into PWM pulse rise information and fall information according to the synchronous position detection result in order to synchronize the horizontal synchronous signal and the PWM pulse. The signal containing the rise information and fall information is then input to the multiphase CLK selection circuit 5. In this embodiment, two sets of signals as shown in T5 in FIG. 17 are output so as to perform interleaving.

The multiphase CLK selection circuit 5 receives the multiphase clock signals output from the multiphase clock generation circuit 2, the synchronous position detection signal output from the synchronous position detection circuit 3, and the signal containing rise information and fall information output from the digital pulse data signal processing circuit 4. The multiphase CLK selection circuit 5 selects an arbitral clock signal from the signals contained in the multiphase clock signals according to the rise information and fall information. The selected clock signals include a clock signal for interleave (IL) switching, a clock signal for Rise1 indicating rise of a first set, a clock signal for Fall1 indicating fall of the first set, a clock signal for Rise2 indicating rise of a second set, a clock signal for Fall2 indicating fall of the second set as shown in T6 in FIG. 17. The selected clock signal is input to the PWM signal generation circuit 6.

The PWM signal generation circuit 6 receives the selected clock signal from the multiphase CLK selection circuit 5. The PWM signal generation circuit 6 generates a pulse width modulation signal or PWM pulse (T7 in FIG. 17) according to the selected clock signal.

This pulse width modulation circuit allows generating a signal having a pulse width corresponding to arbitral data with high-speed and high-accuracy.

It is apparent that the present invention is not limited to the above embodiment that may be modified and changed without departing from the scope and spirit of the invention.

What is claimed is:

1. A pulse width modulation circuit, comprising:
   a multiphase clock generation section generating a multiphase clock signal according to a reference clock; and
   a pulse width modulation signal generation section generating a pulse width modulation signal according to input data and the multiphase clock signal generated by the multiphase clock generation section, by selecting an arbitrary clock signal from the multiphase clock signal in accordance with said input data, wherein the multiphase clock generation section comprises a phase lock loop circuit and generates the multiphase clock signal by phase-interpolating an intermediate clock signal generated by the phase lock loop circuit, wherein the pulse width modulation signal generation section comprises:
 a clock selection circuit selecting the arbitrary clock signal from the multiphase clock signal generated by the multiphase clock generation section according to the input data; and
 a pulse width modulation signal generation circuit generating a pulse width modulation signal according to the clock signal selected by the clock selection circuit, wherein the clock selection circuit includes a first decoder decoding part of input data, a second decoder decoding another part of the input data, a first selector selecting a plurality of clock signals from the multiphase clock signal according to the data decoded by the first decoder, and a second selector selecting an arbitrary clock signal from the plurality of clock signals selected by the first selector according to the data decoded by the second decoder.

2. The pulse width modulation circuit of claim 1, wherein the multiphase clock generation section comprises a phase interpolation circuit in a subsequent stage of a voltage controlled oscillator included in the phase lock loop circuit, and an output signal of the phase interpolation circuit is output as a multiphase clock signal.

3. The pulse width modulation circuit of claim 2, wherein the phase lock loop circuit feeds back an arbitrary clock signal contained in the multiphase clock signal output from the phase interpolation circuit.

4. The pulse width modulation circuit of claim 1, wherein the pulse width modulation signal generation section performs interleave control.

5. The pulse width modulation circuit of claim 1, further comprising:
 a synchronous position detection section receiving the multiphase clock signal generated by the multiphase clock generation section and a horizontal synchronous signal, and detecting a clock synchronous position with the horizontal synchronous signal from a plurality of clocks contained in the multiphase clock signal; and
 a signal processing section converting the input data into rise information and fall information of a pulse width modulation signal according to the clock synchronous position detected by the synchronous position detection section, and outputting it as input data to the multiphase clock selection circuit.

6. The pulse width modulation circuit of claim 1, wherein the pulse width modulation signal comprises a signal for modulating a laser output.

7. The pulse width modulation circuit of claim 1, further comprising:
 a synchronous position detection section receiving the multiphase clock signal generated by the multiphase clock generation section and a horizontal synchronous signal, and detecting a clock synchronous with the horizontal synchronous signal from a plurality of clocks contained in the multiphase clock signal.

8. The pulse width modulation circuit of claim 7, further comprising:
 a signal processing section converting the input data into rise information and fall information of a pulse width modulation signal according to a synchronous position detected by the synchronous position detection section, and outputting it as input data to the multiphase clock selection circuit.

9. A pulse width modulation circuit, comprising:
 a multiphase clock generation section generating multiphase clock signals according to a reference clock;
 a pulse width modulation signal generation section generating a pulse width modulation signal according to input data and the multiphase clock signals generated by the multiphase clock generation section; and
 a synchronous position detection section receiving the multiphase clock signals generated by the multiphase clock generation section and a horizontal synchronous signal, and detecting a clock synchronous with the horizontal synchronous signal from a plurality of clocks contained in the multiphase clock signals,
 wherein the multiphase clock generation section comprises a phase lock loop circuit and generates the multiphase clock signals by phase-interpolating an intermediate clock signal generated by the phase lock loop circuit.

10. The pulse width modulation circuit of claim 9, wherein the multiphase clock generation section comprises a phase interpolation circuit in a subsequent stage of a voltage controlled oscillator included in the phase lock loop circuit, and an output signal of the phase interpolation circuit is output as multiphase clock signals.

11. The pulse width modulation circuit of claim 10, wherein the phase lock loop circuit feeds back an arbitrary clock signal contained in the multiphase clock signals output from the phase interpolation circuit.

12. The pulse width modulation circuit of claim 9, wherein the pulse width modulation signal generation section comprises:
 a clock selection circuit selecting the arbitrary clock signal from the multiphase clock signals generated by the multiphase clock generation section according to the input data; and
 a pulse width modulation signal generation circuit generating a pulse width modulation signal according to the clock signal selected by the clock selection circuit,
 wherein the clock selection circuit includes a first decoder decoding part of input data, a second decoder decoding another part of the input data, a first selector selecting a plurality of clock signals from the multiphase clock signals according to the data decoded by the first decoder, and a second selector selecting an arbitrary clock signal from the plurality of clock signals selected by the first selector according to the data decoded by the second decoder.

13. The pulse width modulation circuit of claim 12, wherein the pulse width modulation signal generation section performs interleave control.

14. The pulse width modulation circuit of claim 8, further comprising:
 a signal processing section converting the input data into rise information and fall information of a pulse width modulation signal according to a synchronous position detected by the synchronous position detection section, and outputting it as input data to the multiphase clock selection circuit.

15. The pulse width modulation circuit of claim 9, wherein the pulse width modulation signal comprises a signal for modulating a laser output.

16. The pulse width modulation circuit of claim 1, wherein the multiphase clock generation section comprises a phase interpolation circuit in a subsequent stage of a voltage controlled oscillator included in the phase lock loop circuit.

17. The pulse width modulation circuit of claim 16, wherein an output signal of the phase interpolation circuit is output as a multiphase clock signal.

18. The pulse width modulation circuit of claim 9, wherein the pulse width modulation signal generation section further comprises a pulse width modulation signal generation circuit generating a pulse width modulation signal according to the clock signal selected by the clock selection circuit.

19. The pulse width modulation circuit of claim 18, wherein the clock selection circuit comprises:

a first decoder decoding part of input data;
a second decoder decoding another part of input data;
a first selector selecting a plurality of clock signals from the multiphase clock signal according to the data decoded by the first decoder; and
a second selector selecting an arbitrary clock signal from the plurality of clock signals selected by the first selector according to the data decoded by the second decoder.

* * * * *